United States Patent [19]
Long et al.

[11] 3,938,010
[45] Feb. 10, 1976

[54] CONTROLLABLE ELECTRICAL SWITCH
[75] Inventors: Donald Charles Long, Yardley, Pa.;
Albert Charles Hartsough,
Willingboro; **Robert Fincher
Sanford,** Titusville, both of N.J.
[73] Assignee: Princeton Electro Dynamics, Inc.,
Princeton Junction, N.J.
[22] Filed: Mar. 5, 1975
[21] Appl. No.: 555,700

[52] U.S. Cl. .................. 317/155.5; 317/148.5 B
[51] Int. Cl.² ....................................... H01H 47/32
[58] Field of Search .... 317/148.5 R, 148.5 B, 155.5

[56] References Cited
UNITED STATES PATENTS

| | | | |
|---|---|---|---|
| 3,182,222 | 5/1965 | Lacy et al. | 317/148.5 B |
| 3,349,373 | 10/1967 | Kleist et al. | 317/155.5 X |
| 3,543,103 | 11/1970 | Pinckaers | 317/155.5 X |

*Primary Examiner*—J. D. Miller
*Assistant Examiner*—Harry E. Moose, Jr.
*Attorney, Agent, or Firm*—Charles I. Brodsky

[57] ABSTRACT

An electrical switch which can be remotely conditioned to an "ON" or "OFF" state, but which can also be controlled at the switch location, if desired. The conditioning of the switch is controlled by a means of a bistable electromechanical relay, a pair of silicon controlled rectifiers, a pair of transistors, and a pair of capacitance discharge circuits.

6 Claims, 1 Drawing Figure

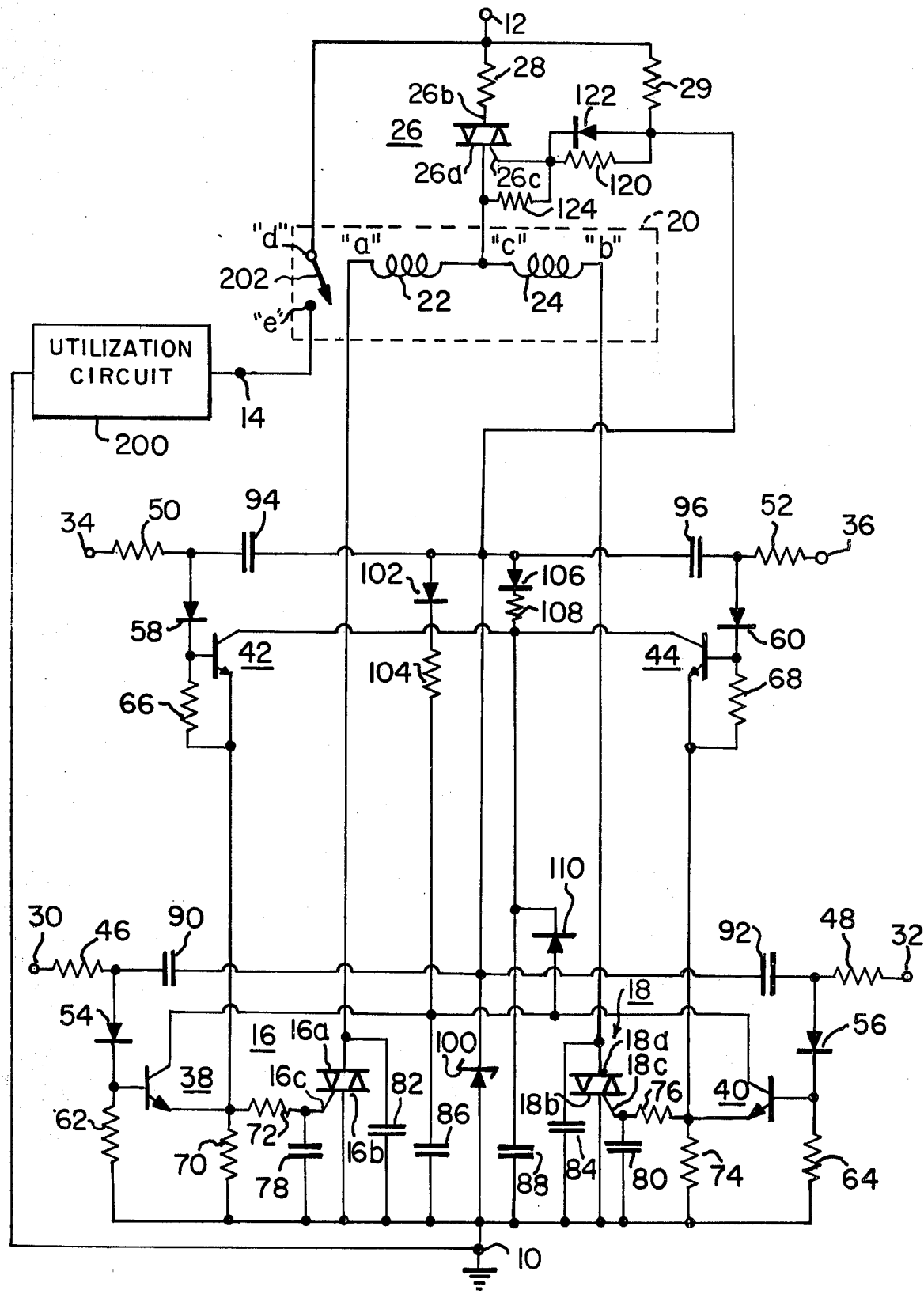

3,938,010

CONTROLLABLE ELECTRICAL SWITCH

FIELD OF THE INVENTION

This invention relates to electrical make and break switches, in general, and to such switches which can be remotely conditioned to an "ON" or "OFF" state for office buildings, schools and manufacturing facilities where computer control of light switches, for example, is employed as a means to reduce costs of electricity.

SUMMARY OF THE INVENTION

As will become clear hereinafter, the construction of the present invention is similar to those described in pending United States Patent Applications Ser. Nos. 390,532 and 423,229, now U.S. Pat. Nos. 3,829,683 and 3,869,651, respectively, assigned to the same assignee as is this invention, in its use of a bistable electromechanical relay and a pair of silicon controlled rectifiers to provide local and remote controls in energizing and de-energizing electrical devices. As with the constructions there described, the embodiment of this invention is designed to interface with computer, low voltage systems, so that the switch of the invention can be connected to the computer control center by low voltage, low current carrying conductors.

The arrangement described below is thus also especially attractive for use where the switches are employed in the control of lighting in office buildings, schools, and manufacturing plants, for example. Computer control signals could be coupled, as with the configurations of the Ser. Nos. 390,532 and 423,229 applications, to turn off all lights in a particular part of the facility automatically after the work day has ended. Correspondingly, control signals can be sent to those switches at the beginning of the work day, to automatically turn all lights on. In those installations where personnel periodically make security checks, the computer can transmit control signals to turn the lights on just before the guard makes his rounds, and to turn them off after they are completed. Conversely, all lights in a different part of a facility can be controlled to their temporary ON condition at the end of a work day, to be later turned off by a person working in that area at that time. Similarly, the computer control signal can be such as to place all lights in their temporary OFF mode just before the work day begins, to be individually turned on by the employees as they appear for work.

As will be seen below the transformer used in both the Ser. Nos. 390,532 and 423,229 cases is omitted from the switch construction of the present invention. In particular, whereas the transformer was employed to provide the electrical power for the bistable relay and the silicon controlled rectifiers of the arrangements there described, a pair of low wattage resistors are utilized in the present configuration — one, to provide the power for the relay, and the other, to provide the power for the control circuitry. Because the transformer in those prior designs represented a significant percentage of the overall cost, its elimination and replacement by significantly less expensive resistors make the switch of the present invention far more attractive from a cost standpoint. Cost reductions of 30% and more have thus been realized with the instant configuration, as compared with those previous designs.

BRIEF DESCRIPTION OF THE DRAWING

These and other features of the present invention will be more readily understood from a consideration of the following description taken in connection with the accompanying drawing which shows a schematic diagram of an electrical switch embodying the invention, capable of being controlled both from local and remote locations.

DETAILED DESCRIPTION OF THE DRAWING

In the drawing, three terminals 10, 12 and 14 are shown. Terminal 10 serves as a ground or reference terminal while terminal 12 serves to supply the operating voltage for the system. Such voltage as is supplied between terminals 10, 12 may be of the order of 120 volts alternating line voltage, but in alternative embodiments of the invention may be of 277 volts rms magnitude as that represents the lateral voltage which is oftentimes employed in large office buildings in order to save copper costs. Present in the prior constructions of the Ser. Nos. 390,532 and 423,229 applications, but omitted from the present construction, was the primary winding of a transformer coupled between the terminals 10 and 12 and a pair of secondary windings serially coupled to step the applied alternating voltage down to an amplitude suitable for powering the circuits of the construction.

As in those constructions, a pair of silicon controlled rectifiers 16, 18 and a bistable electromechanical relay 20 are also shown in this case. As indicated, one power electrode 16a of rectifier 16 is connected to one end *a* of a relay coil 22 in the bistable unit 20, while a second power electrode 16b of rectifier 16 is coupled to the reference potential point. In corresponding manner, one power electrode 18a of rectifier 18 is coupled to one end *b* of a second relay coil 24 in the bistable unit 20 while a second power electrode 18b of rectifier 18 is coupled to the ground point. The opposite end of the relay coil 22 and the opposite end the relay coil 24 are joined together at *c*, to which point is coupled one power electrode 26a of a third silicon controlled rectifier 26. The second power electrode 26b of the rectifier 26, on the other hand, is coupled by a low wattage resistor 28 to the supply terminal 12. As will be understood, current flowing through the relay coil 22 constitutes the "make" condition for the electrical switch, in which case a closed circuit path will exist between the terminal 12 and the third terminal of the drawing 14, to which terminal a utilization circuit 200 referenced to terminal 10 is connected, so as to draw power from terminal 12. It will also be understood that current flowing through the relay coil 24 will "break" the switch connection, and open the circuit path between the terminals 12 and 10. The switch connection is particularly illustrated by the contact arm 202, joining points *d* and *e* of the relay 20 when closed.

Four control terminals 30, 32, 34 and 36, and four transistors 38, 40, 42 and 44 are also shown. As indicated, the collector electrodes of transistors 38 and 40 are interconnected — as are the corresponding collector electrodes of the transistors 42, 44 —, the emitter electrodes of transistors 38 and 42 and of transistors 40 and 44 being interconnected as well. The input circuits to the transistors 38, 40, 42 and 44 are identical in each instance, comprising a first resistor, a semiconductor rectifier and a second resistor serially coupled in the order named from the control terminal associated with the transistor, with the junction between the rectifier and the second resistor being further connected to the base electrode of the transistor illustrated. With the transistors 38, 40, 42 and 44 being of N-P-N type classification, the connection to the base electrode is from the junction of the second resistor with the cathode electrode of the semiconductor rectifier, the "first" resistors being respectively numbered 46, 48, 50, and 52; the semiconductor rectifiers being respectively numbered 54, 56, 58, and 60; and the "second" resistors being respectively numbered 62, 64, 66, and 68. The remote ends of resistors 62 and 64 will be seen as connecting to the ground terminal 10, while the remote ends of resistors 66, 68 will be noted as connecting to the emitter electrodes of transistors 42, 44, respectively.

Four resistors and eight capacitors are further shown in the bottom portion of the switch drawing. Resistors 70 and 72 respectively couple the joined emitter electrodes of transistors 38 and 42 first, to the reference terminal 10 and second, to the gate electrode 16c of the silicon controlled rectifier 16. In similar fashion resistors 74 and 76 respectively couple the joined emitter electrodes of the transistors 40 and 44 first, to the reference terminal 10 and second, to the gate electrode 18c of the silicon controlled rectifier 18. Capacitors 78 and 80 bypass the gate electrodes 16c and 18c to ground, capacitors 82 and 84 bypass the power electrodes 16a and 18a to ground, and capacitors 86 and 88 similarly bypass the joined collector electrodes of transistors 38 and 40 and of transistors 42 and 44. The remaining two capacitors 90, 92 are serially connected between the anode electrodes of the semiconductor rectifiers 54, 56, with corresponding capacitors 94, 96 being similarly coupled between the anode electrodes of the semiconductor rectifiers 58 and 60 in the middle portion of the drawing. A zener diode 100 is additionally included, having its anode electrode connected to the reference terminal 10 and its cathode electrode connected to the junctions both of capacitors 90 and 92 and of capacitors 94 and 96. As will be readily apparent, the zener diode 100 and its connections divide the switch, as so far described, effectively into left-hand and right-hand portions with — as will be seen from the table of component values at the end of this specification — almost identical equivalencies. Neglecting, for the time being, the circuit constructions to the silicon controlled rectifier 26, the arrangement of the switch is completed by the addition of three more semiconductor rectifiers and two more resistors.

As indicated, the first of these rectifiers 102 is serially coupled, with its anode electrode at the junction beween capacitors 94 and 96, via the resistor 104 to the joined collector electrodes of transistors 38 and 40. The second of these rectifiers 106 is serially coupled, with its anode electrode at the same capacitor junction, via the resistor 108 to the joined collector electrodes of transistors 42 and 44. The third semiconductor rectifier 110 is shown with its anode electrode connected to the joined collector electrodes of transistors 38 and 40 and with its cathode electrode connected to the joined collector electrodes of transistors 42 and 44. As will be seen from the table of component values, corresponding components in the left-hand portion of the drawing are of identical value to the corresponding components in the right-hand portion, except that the capacitance value of the capacitor 88 is an order of magnitude greater than the capacitance value of capacitor 86 and the resistance value of resistor 104 is an order of magnitude greater than the resistance value of resistor 108.

Before proceeding with a discussion of the operation of the illustrated circuit, it will first be understood that the control terminals 30 and 32 are available for local user control over the switch, whereas the control terminals 34 and 36 are available for remote, over-riding, or "priority" switch control. It will also be understood (though not so shown) that a single pole switch is available at each of the terminals 30, 32, 34, 36, for purposes of "grounding" such terminal. Although assumed in this manner for purposes of illustration, a more typical construction would incorporate a single pole, double throw switch for each of the terminal pairs 30, 32 and 34, 36, as will be readily apparent to one skilled in the art. In the discussion that immediately follows it will be assumed that the silicon controlled rectifier 26 is always conducting, so that the low wattage resistor 28 applies the voltage at terminal 12 directly to the end c of the relay 20. A second low wattage resistor 29 couples this same voltage from terminal 12 to the cathode electrode of the zener diode 100.

In operation, let it first be assumed that each of the control terminals 30, 32, 34 and 36 are open-circuited, and that zener diode 100 regulates the voltage developed at the junction of capacitors 90, 92, 94 and 96, to be a square wave pulse extending substantially from ground to +10 volts. As the voltage at this junction pulsates with line alternations in this manner, there is developed a voltage of some 10 volts across each of the capacitors 90, 92, 94 and 96, with the capacitive plate closer the control terminal being effectively at −10 volts. Each of the transistors 38, 40, 42 and 44 are non-conductive, as are the silicon controlled rectifiers 16 and 18. If any one control terminal is then short-circuited to ground, a portion of the negative charge stored on its associated capacitor will leak-off, and a subsequent pulsating cycle at the aforementioned junction will bring its transistor to conduction. A pulse will thus be coupled to the gate electrode of one of the controlled rectifiers 16, 18, triggering it to conduction and completing a circuit path through one of the relay coils 22 or 24.

To be more specific, consider the case where control terminal 30 is momentarily grounded. As the pulse developed at the junction of capacitors 90, 92 rises towards its +10 volt peak, a point will be reached at which transistor 38 conducts, to couple a positive signal to gate electrode 16c of the rectifier 16. This renders the silicon controlled device conductive, and a closed-circuit path is completed via resistor 28 to cause a current flow through the coil 22. The result will be the closure of the contact arm 202, representing the make condition of the switch, by means of which the utilization circuit 200 is energized.

Assume, further, that terminal 30 is thereafter held grounded. As will be readily apparent, the time constant control of semiconductor rectifier 102, resistor 104 and capacitor 86 acts to reduce the voltage initially applied at the collector electrodes of transistors 38 and 40 towards ground. If control terminal 32 were, then, also grounded, there would be insufficient energy at the collector electrode of transistor 40 to permit it to become conductive. Grounding control terminal 30 thus represents a means by which the utilization circuit 200 (a bank of lights, for example) is turned on, and held on through local user control. Conversely, if control terminal 30 were open-circuited, then a momentary grounding of terminal 32 would render transistor 40 and silicon controlled rectifier 18 conductive, and cause a flow through the coil 24. This would open the contact arm 202 and place the switch in its break condition. If terminal 32 were thereafter held grounded, subsequent grounding of terminal 30 would have no effect — as, in this case, the combination of rectifier 102, resistor 104 and capacitor 86 would reduce the available energy for conduction at the collector electrode of transistor 38. Grounding control terminal 32 thus represents a means by which the utilization circuit 200 is turned off, and held off through local control.

Just as holding control terminal 30 connected to ground will place the bistable relay 20 in its make condition and holding the control 32 to ground will place the relay in its break condition, it will be readily apparent that once the short-circuit to ground is removed from either of these terminals, then the state of the switch will be controlled by the grounding of the other, local user terminal. Thus, if the short-circuit to ground on terminal 30 were removed, a subsequent short-circuiting to ground of control terminal 32 would switch the relay from its make to its break condition. On the other hand, if the short-circuiting of control terminal 32 to ground were removed, then further short-circuiting to ground of control terminal 30 would reinstate the relay 20 to its make state. It will additionally be appreciated that the rectifier 102, resistor 104, capacitor 86 combination serves not only to prevent the opposite side transistor from being rendered conductive when one terminal is held grounded, but, after a few cycles of pulsation, also serves to render its own transistor non-conductive because of the reduction in collector energization. This reduces power dissipation over the case where the controlled rectifiers 16 or 18 are permitted to continue operating.

Consider, now, the case where the control terminal 30 is grounded by the local user in order to place the switch in its make condition and it is desired to break the switch by remote, priority control. Thus, momentarily grounding terminal 36 changes the conductivity state of transistor 44, thereby triggering the silicon controlled rectifier 18 to pass a current through the relay coil 24. This current opens the contact arm 202 and removes the utilization device 200 from between the power terminals 12, 10. This will be seen to occur even though the control terminal 30 were grounded to begin with. The reason for this is that the rectifier 102, resistor 104, capacitor 86 combination is coupled to the collector electrodes of transistors 38 and 40, but not to the collector electrodes of either transistors 42 or 44.

If, on the other hand, terminal 36 were grounded before terminal 30, the same control would result. That is, the time constant control of the rectifier 106, resistor 108 and capacitor 88 combination would, in this case, not only reduce the collector electrode voltage of transistor 42 so as to prevent that transistor from having its state switched, but would also prevent transistor 38 from being rendered conductive as the semiconductor rectifier 110 would limit the available energy at the collector electrode of transistor 38 below that needed to power that transistor. In the manner previously described, the combination of the rectifier 106, the resistor 108 and the capacitor 88 would also prevent transistor 42 from firing into the gate electrode of the silicon controlled rectifier 16 if, while terminal 36 were grounded, control terminal 34 were also short-circuited to ground. Thus, closing terminal 36 to ground and holding it there, not only would place the bistable electromechanical relay 20 in the break condition for the switch, but would further take precedence over local, user control attempts to render the switch operative.

On the other hand, if terminal 36 where then open-circuited and control terminal 34 were connected to ground, then the bistable electromechanical relay 20 would be placed in its make condition irrespective of any attempt to change the state of the switch by grounding either control terminal 32 or control terminal 36. In this way, priority of control can be effected.

As was previously mentioned, the time constant formed by the resistor 104 and the capacitor 86 is different from the time constant formed by the resistor 108 and the capacitor 88. The reason for this is to take into accound possible instances where all control terminals were held open-circuited, and then, terminals 30 and 36 (or 32 and 34) were switched to ground almost simultaneously. In this case, there could be a period of hesitation by the circuit as to which mode is to take effect. The time constant for resistor 108 and capacitor 88 is selected greater than that for resistor 104 and capacitor 86, however, so that the transistor 44 (or 42) will be able to sustain itself for a greater period of time and thereby permit the priority control 36 (or 34) to take precedence.

In the discussion that preceeded, it was assumed that the silicon controlled rectifier 26 was always conducting, and that the power for the electromechanical relay 20 was provided by the resistor 28. In actuality, the silicon controlled rectifier 26 is not always conducting. As shown in the drawing, the gate electrode 28c of the controlled rectifier 28 is coupled via a resistor 120 and via a parallel connected rectifier 122 to the junction of resistor 29 with zener diode 100. Also shown is a further resistor 124 coupled between the power electrode 26a and the gate electrode 26c.

It will be readily apparent that if the silicon controlled device were always conducting, then for those instances where the switch is neither opened nor closed (i.e., all terminals 30, 32, 34, 36 being open-circuited), the junction of the relay coils 22, 24 would be at the power line voltage. Even though such voltage would generally not be accessible as a shock hazard, good engineering practive dictates the potential at this junction to be closer to the 24 volts or so voltage rating of the relay windings.

The silicon rectifier 26 thus serves to isolate the relay coils from the power line voltage until one of the control terminals is coupled to ground. At the time of such connection, the cathode electrode of the device 26a is effectively grounded, and the subsequent rising voltage applied to the gate electrode 26c brings the silicon rectifier to conduction where it operates in the aforedescribed manner.

While applicants do not wish to be limited to any particular set of values, the following have proved useful in one embodiment of the described invention:

| | |
|---|---|
| Resistor 28 | 150 ohms, ½ watt |
| Resistor 29 | 47 kilohms, ½ watt |
| Resistors 46, 48, 50, 52 | 1 megohm |
| Resistors 62, 64, 66, 68 | 33 kilohms |
| Resistors 70, 74 | 150 ohms |
| Resistors 72, 76 | 1.5 kilohms |
| Resistor 104 | 1 megohm |
| Resistor 108 | 100 kilohms |
| Resistor 120 | 200 kilohms |
| Resistor 124 | 2 kilohms |

-continued

| | | |
|---|---|---|
| Capacitors 78, 80, 82, 84 90, 92, 94, 96 | .01 | micro-farads |
| Capacitor 86 | .1 | micro-farads |
| Capacitor 88 | 1.5 | micro-farads |
| Semiconductor diodes | all | 1N914 |
| Transistors | all | 2N3643 |
| Silicon controlled rectifiers | all | 2N6241 |
| Zener diode 100 | | 1N714 |
| Bistable relay 20 | | GE RR7 |

As was previously described, and as can be seen from the component values set forth immediately above, one ½ watt resistor 28 is utilized to provide the power for the relay 20 and the rectifiers 16, 18, while a second ½ watt resistor 29 is utilized to provide the power for the control circuitry, including the transistors 38, 40, 42 and 44. These resistors essentially serve as fuses in that should any of the silicon controlled rectifiers unexplainably short circuit, the resulting duty cycle of current flow would be sufficient to burn up these resistors in a relatively short time. Resistors of ¼ or ⅛ watt power ratings should also be sufficient for use in the illustrated circuit.

Such control operations as have been described will be readily seen as being particularly desirable in controlling office lighting, for example. Thus, at the end of the work day the control terminal 36 can be computer coupled to ground, to permanently turn off all lighting in a specified portion of a facility. If security checks are then to be made, the control terminal 36 is open-circuited and the control terminal 34 is computer coupled to ground to permanently turn on all lighting. After the guard completes his rounds, the control terminal 34 can be disconnected from ground, to thereby remove all priority control over the office lighting, and terminal 36 can be momentarily grounded to temporarily turn all lights off. At the beginning of the work day, workers can individually illuminate their work areas as they come on the job, by coupling the terminal 30 to ground. At the end of the work day, they can individually turn off the lighting in their areas, by disconnecting the control terminal 30 and by grounding the terminal 32. It will be readily understood and appreciated that this manner of electricity control can serve to greatly lessen electricity costs in factories, office buildings, schools and the like.

While there has been described what is considered to be a preferred embodiment of the present invention, it will be apparent to those skilled in the art that other configurations can be devised without departing from the scope of the teachings herein of eliminating the previously employed transformer in powering the electrical circuits used in making and breaking electrical connections. It will be understood that the resistive and capacitive component replacements for the transformer of the Ser. No. 390,532 and 423,229 cases cost substantially less, and occupy much less space, than the previously used transformer. Whereas the transformers previously used functioned to step-down the applied alternating voltage to a level at which the described trigger circuits would operate, it will be seen that the necessary lower voltage is here provided through the use of zener diode technology. Once the transformer is eliminated, it will also be seen that higher voltage rated silicon controlled devices would be needed, as the previously used transformer stepped down the voltage for their power electrodes at the same time. As will be appreciated, this voltage rating will be substantially in excess of the breakdown voltage of the zener diode.

What is claimed is:

1. A controllable electrical switch, comprising:
   first and second terminals; and
   actuating means for making electrical connection between said terminals when closing said switch, and for breaking said electrical connection when opening said switch;
   said actuating means including:
   a. a bistable electromechanical relay having an input electrode coupled to said first terminal and an output electrode coupled to said second terminal, and conditionable to one of a low and high impedance state between its input and output electrodes as a function of current flow therein;
   b. a pair of semiconductor control devices, each having an input circuit, and each having an output circuit respectively coupled to said electromechanical relay such that a conductivity condition in one of said devices produces a current flow in said relay as to place it in its low impedance state and such that a conductivity condition in the other of said devices produces a current flow in said relay as to place it in its high impedance state;
   c. a pair of pulse triggering circuits for signal pulsing the input circuits of said semiconductor control devices to change the conductivities thereof, with said changes in conductivity conditions serving to change the current flow through the output circuits of said control devices to change the impedance state of said bistable relay in actuating said electrical switch from a make to a break condition and vice versa;
   d. a first power supply means for energizing said bistable electromechanical relay and said pair of semiconductor control devices; and
   e. a second power supply means for energizing said pulse triggering circuits at a lower potential than energizes said bistable relay and said pair of control devices.

2. The controllable electrical switch of claim 1 wherein said second power supply means energizes said pulse triggering circuits at a potential at least one order of magnitude less than that which energizes said bistable relay and said pair of control devices.

3. The controllable electrical switch of claim 1 wherein there is also included a third semiconductor control device having an output circuit arranged to couple said first power supply means to said bistable relay and to said pair of semiconductor control devices, and also having an input circuit arranged to disable said output circuit for a non-operative state of said pulse triggering circuits.

4. The controllable electrical switch of claim 1 wherein said second power supply means includes a zener diode having a breakdown voltage comparable to the potential at which said pulse triggering circuits are energized.

5. The controllable electrical switch of claim 4 wherein said pair of semiconductor control devices have a voltage rating substantiallly in excess of the breakdown voltage of said zener diode.

6. The controllable electrical switch of claim 5 wherein each of said first and second power supply means includes a fusible resistor through which said energizing potentials are applied to said bistable relay, said pair of semiconductor control devices and said pulse triggering circuits.

* * * * *